US008389592B2

(12) United States Patent
de Oliveira et al.

(10) Patent No.: US 8,389,592 B2
(45) Date of Patent: Mar. 5, 2013

(54) OPTICAL ELEMENTS WITH GRADIENT STRUCTURE

(75) Inventors: Peter William de Oliveira, Saarbruecken (DE); Michael Veith, St.-Ingbert (DE); Peter Rogin, Saarbruecken (DE); Hechun Lin, Saarbruecken (DE); Marcus Geerkens, Quierschied (DE)

(73) Assignee: Leibniz-Institut fuer Neue Materialien Gemeinnuetzige GmbH, Saarbruecken (DE)

( * ) Notice: Subject to any disclaimer, the term of this patent is extended or adjusted under 35 U.S.C. 154(b) by 95 days.

(21) Appl. No.: 12/867,516

(22) PCT Filed: Feb. 11, 2009

(86) PCT No.: PCT/EP2009/000952
§ 371 (c)(1),
(2), (4) Date: Aug. 13, 2010

(87) PCT Pub. No.: WO2009/100895
PCT Pub. Date: Aug. 20, 2009

(65) Prior Publication Data
US 2010/0321784 A1    Dec. 23, 2010

(30) Foreign Application Priority Data
Feb. 14, 2008 (DE) .......... 10 2008 009 332

(51) Int. Cl.
*C08F 2/46* (2006.01)
(52) U.S. Cl. .......... 522/75; 522/2; 522/3; 522/76; 522/78; 430/321

(58) Field of Classification Search .......... 522/2, 3, 522/75, 76, 78; 430/321
See application file for complete search history.

(56) References Cited

U.S. PATENT DOCUMENTS

| | | | |
|---|---|---|---|
| 3,658,526 A | 4/1972 | Haugh | |
| 4,942,112 A | 7/1990 | Monroe et al. | |
| 4,959,284 A | 9/1990 | Smothers et al. | |
| 5,013,632 A | 5/1991 | Weber | |
| 5,098,803 A | 3/1992 | Monroe et al. | |
| 5,453,340 A | 9/1995 | Kawabata et al. | |
| 5,529,473 A | 6/1996 | Lawton et al. | |
| 5,552,261 A | 9/1996 | Kraska et al. | |
| 6,136,234 A * | 10/2000 | Liu et al. | 264/1.27 |
| 6,268,089 B1 | 7/2001 | Chandross et al. | |

(Continued)

FOREIGN PATENT DOCUMENTS

| | | |
|---|---|---|
| DE | 102004061324 A1 | 6/2006 |
| DE | 102005025315 A1 | 12/2006 |

(Continued)

OTHER PUBLICATIONS

Lin, Hechun, et al., "Ionic Liquid as Additive to Increase Sensitivity, Resolution, and Diffraction Efficiency of Photopolymerizable Hologram Material," Applied Physics Letters, vol. 93, No. 14, Oct. 6, 2008.

(Continued)

*Primary Examiner* — Vu A Nguyen
(74) *Attorney, Agent, or Firm* — Cahn & Samuels, LLP

(57) ABSTRACT

Optical elements, in particular for holographic applications, have a gradient structure formed by a refractive index gradient and include one or more organic polymers and at least one ionic liquid.

13 Claims, 4 Drawing Sheets

U.S. PATENT DOCUMENTS

| | | |
|---|---|---|
| 6,482,551 B1 | 11/2002 | Dhar et al. |
| 6,936,196 B2 | 8/2005 | Chandross et al. |
| 6,969,578 B2 | 11/2005 | Robello et al. |
| 7,022,392 B2 | 4/2006 | Dinnocenzo et al. |
| 7,163,769 B2 | 1/2007 | Cheben et al. |
| 7,390,532 B2 | 6/2008 | Dellwo et al. |
| 2003/0157414 A1 | 8/2003 | Dhal et al. |
| 2004/0158009 A1 | 8/2004 | Mays et al. |
| 2005/0101698 A1 | 5/2005 | Harada et al. |
| 2005/0231773 A1 | 10/2005 | Sasa et al. |
| 2007/0276101 A1 | 11/2007 | Matyjaszewski et al. |
| 2008/0081264 A1 | 4/2008 | Mennig et al. |
| 2008/0194831 A1 | 8/2008 | Ignatyev et al. |
| 2008/0311380 A1 | 12/2008 | Agrawal |
| 2011/0236804 A1 | 9/2011 | De Oliveira et al. |
| 2011/0242631 A1 | 10/2011 | de Oliveira et al. |

FOREIGN PATENT DOCUMENTS

| | | | |
|---|---|---|---|
| JP | 2007 052382 A | 3/2007 | |
| JP | 2008 026492 A | 2/2008 | |
| WO | 02/079269 A1 | 10/2002 | |
| WO | 2003/058292 | 7/2003 | |

OTHER PUBLICATIONS

Wasserscheid, P., et al., "Ionic Liquids in Synthesis", Wiley-VCH, 2002.
Kubisa, P., et al., "Ionic Liquids in the Synthesis and Modification of Polymers," Polym. Sci. Part A Polym. Chem. 2005, vol. 43, pp. 4675-4683.
Winteron, N., et al. "Solubilization of Polymers by Ionic Liquids," Journal of Materials Chemistry, 2006, vol. 16, pp. 4281-4293.
Hong, K., et al., "Coventional Free Radical Polymerization in Room Temperature Ionic Liquids: A Green Approach to Commodity Polymers with Practical Advantages," Chem. Commun., 2002, pp. 1368-1369.
Zhang, H., et al., "Synthesis of Block Copolymers of Styrene and Methyl Methacrylate by Conventional Free Radical Polymerization in Room Temperature Ionic Liquids," Macromolecules, 2002, vol. 35, p. 5738-5741.
Strehmel, V., et al, "Free Radical Polymerization of n-Butyl Methacrylate in Ionic Liquids," Macromolecules, 2006, vol. 39, pp. 923-930.
Kogelnik, H., "Coupled Wave Theory for Thick Hologram Gratings," Bell Syst. Techn. J., Nov. 1969, vol. 48, No. 9, pp. 2909-2947.
Creary, X., et al., "Preparation of 1-Butyl-3-Methylimidazolium Tetrafluoroborate," Organic Synthesis, 2005, vol. 82, 166.
English translation of International Preliminary Report on Patentability, Sep. 2010.
English Abstract of DE102004061324, 2006.
English Abstract of WO02079269, 2002.
English Abstract of DE102005025315, 2006.
English Abstract of WO03058292, 2003.
English Abstract of JP 2007 052382, 2007.
English Abstract of JP 2008 026492, 2008.

* cited by examiner

OPTICAL ELEMENTS WITH GRADIENT STRUCTURE

This patent application is a U.S. national stage application of PCT international application PCT/EP2009/000952 filed on 11 Feb. 2009 and claims priority of German patent document 10 2008 009 332.7 filed on 14 Feb. 2008.

FIELD OF THE INVENTION

The invention relates to optical elements having a gradient structure, in particular for holographic applications, wherein the gradient structure is formed by a refractive index gradient, and also a process for producing these optical elements having a gradient structure.

BACKGROUND OF THE INVENTION

It is known from the U.S. Pat. Nos. 5,552,261 and 5,529,473 that the diffusion of monomers having an increased or reduced refractive index compared to a surrounding liquid matrix can be used for producing a refractive index gradient. This effect, which is known in the case of polymers as the Colburn-Haines effect, can lead after subsequent polymerization to a product having a refractive index gradient. Such polymers are also referred to as photopolymers.

U.S. Pat. Nos. 3,658,526, 4,959,284, 4,942,112, 5,013,632, 5,098,803 (E.I. Du Pont Nemours) describe the preparation of photopolymers by free-radical polymerization of monomers in a solid medium. This not only requires the exclusion of oxygen, but severe shrinkage of the material also occurs as a result of the polymerization. Moreover, the addition of a solvent is necessary for the coating of surfaces. The thickness of the material is therefore restricted to up to 150 μm.

U.S. Pat. No. 6,482,551 describes the use of a matrix which is polymerized in a first step. The monomers of the photopolymer are polymerized only in a second step to form the actual photopolymer. Since the mixture of the monomers and the matrix can be selected so as to be liquid, no addition of a solvent is necessary for the coating of surfaces and coatings having a thickness of over some millimeters can be produced. The monomers of the photopolymer and of the matrix must not react with one another in any of the steps. Thus, U.S. Pat. No. 5,453,340 uses cationically polymerizable monomers such as epoxides or oxetanes which can be polymerized using Bronsted or Lewis acids for the matrix and free-radically polymerizable monomers for the photopolymers. This again leads to high shrinkage in the illuminated regions. In addition, the material also has to be illuminated twice with different wavelengths.

In the patent applications US 2003/0157414 and US 2005/0231773, epoxides, for example, are used as monomers for the photopolymer in order to reduce shrinkage. However, these compositions require a higher energy for writing of the optical information, i.e. on illumination, than the above-described materials which are based on free-radical polymerization.

U.S. Pat. Nos. 7,022,392 and 6,969,578 are concerned not only with a polymerization of monomers but also with photoisomerization of individual molecules which leads to a local change in the refractive index. Only small changes in illumination therefore occur in the case of these. However, this system requires special monomers.

Experiments aimed at providing a photopolymer in an inorganic-organic matrix are described in the U.S. Pat. Nos. 6,268,089 and 7,163,769. The matrix is produced in a sol-gel process and the photopolymer is polymerized both free-radically and cationically. The materials obtained do not display any great advantages over the previously known materials.

Another way of producing gradient structures is described by the patent application US 2005/0101698. Here, a concentration gradient of nanoparticles is produced in a composite and fixed by polymerization of the matrix surrounding these. This process makes it possible to produce volume holograms having a refractive index of 90%. However, the thickness of the layers is limited and the material displays high shrinkage because of the free-radical polymerization.

In summary, the development of photopolymers has made great progress in recent years, but the known systems still have some disadvantages. Thus, the systems used are not sensitive enough to allow very sharp modulation of the refractive index. Here, the sensitivity is in terms of not only the light intensity required for polymerization but also the illumination time required for producing the gradient structure. Both limit the resolution and refractive efficiency of the gradient structures produced. At the same time, the bandwidth of refractive index modulation achieved in the material also plays an important role. Both parameters mentioned limit, for example, the minimum layer thickness of the material at which the production of optical gradient structures is still possible.

Since optical gradient structures are nowadays used in many fields having extremely different requirements, for example in respect of mechanical flexibility, thickness and stability, a high variability of the components used is of great importance.

PROBLEM

The problem addressed by the invention is to provide a simple, universally applicable and inexpensive process for producing optical elements having a gradient structure, which process overcomes the indicated disadvantages of the prior art.

SUMMARY OF INVENTION

This problem is solved by the inventions having the features of the independent claims. Advantageous developments of the inventions are characterized in the dependent claims. The wording of all claims is hereby incorporated by reference into the present description. The invention also encompasses all meaningful and in particular all specified combinations of independent and/or dependent claims.

In the process of the invention for producing optical elements having a gradient structure, in particular for holographic applications, the gradient structure is formed by a refractive index gradient which is produced by means of the following steps:

(a) Production of a composition by mixing one or more polymerizable or polycondensable organic monomers and at least one ionic liquid;

(b) Generation of a potential difference by directed diffusion of the monomers to form a refractive index gradient by initiation of local polymerization or polycondensation.

Individual process steps are described in more detail below. The steps do not necessarily have to be carried out in the order indicated and the process to be explained can also have further steps which are not mentioned.

The potential difference generated is preferably a chemical potential difference, for example analogous to the above-described Colburn-Haines effect which is based on the following mechanism: in the case of a local (e.g. thermally and/or photochemically initiated) polymerization or polycondensation of species having polymerizable or polycondensable groups, e.g. carbon-carbon multiple bonds or epoxide rings, the polymerization or polycondensation leads to a depletion of polymerizable or polycondensable groups in the regions in which the polymerization or polycondensation takes place. This leads to directed diffusion of monomers having as yet unreacted polymerizable or polycondensable groups to the (heated or illuminated) regions in which the polymerization or polycondensation takes place or has taken place in order to even out the chemical potential difference. These monomers are available for polymerization in these regions. This leads to a change in the optical density and thus to a local increase or reduction in the refractive index in the heated or illuminated regions.

The expressions "polymerization" and "polymerizable" used above also include polyaddition and groups capable of polyaddition.

It has now surprisingly been found that the formation of a refractive index gradient can be significantly improved and accelerated by addition of at least one ionic liquid. This will be discussed more comprehensively below.

The chemical potential difference is preferably generated by illumination or irradiation with electrons, in particular by means of holographic or lithographic techniques or by the Maskaligner technique. Selective irradiation or illumination of the composition can, e.g. at local places, trigger a polymerization or polycondensation in a targeted manner, leading to a chemical potential difference which in turn leads to directed diffusion of the monomers and to formation of a refractive index gradient.

Without wishing to be tied to a particular system, this could be explained by the local polymerization or polycondensation formed in a component having a particular refractive index or increasing the concentration thereof there, while the refractive index of the other regions is likewise altered by the diffusion of the monomers.

In a great simplification, the system before application of the potential difference can also be viewed as a homogeneous mixture of two components having different refractive indices; the term component here also encompasses precursor compounds for a component. The directed diffusion results in local changes in the proportions of the two components. This causes the refractive index gradients observed.

It follows therefrom that, as mentioned above, the change in the refractive index is always relative to the regions without polymerization or polycondensation. The critical thing is the resulting difference in the refractive index. Which region has a higher or lower refractive index can, for example, be determined by the choice of the monomers and of the ionic liquid or of other components.

For the illumination processes, preference is given to using UV light or laser light. When a laser is used as light source, both periodic grating structures and also Fresnel structures can be produced by holographic techniques. The intensity profiles occurring as a result of interference then act as polymerization sinks. In the case of the particularly preferred holographic illumination, it is possible to produce, e.g. by means of two-wave mixing, phase-modulated volume holograms as transmission or reflection holograms (Kogelnik 1969).

As coherent light source, it is possible to use, for example, an argon ion laser.

After production of the gradient structure, the monomers which have not been polymerized or not been polycondensed can react uniformly by nonlocal initiation of a polymerization or polycondensation, for example by illumination which is not intensity modulated. Since directed diffusion no longer occurs at this stage, there is at most a slight weakening of the refractive index gradient already produced. However, the durability of the gradient structures produced can be significantly improved in this way.

DETAILED DESCRIPTION OF THE INVENTION

Figure 1:
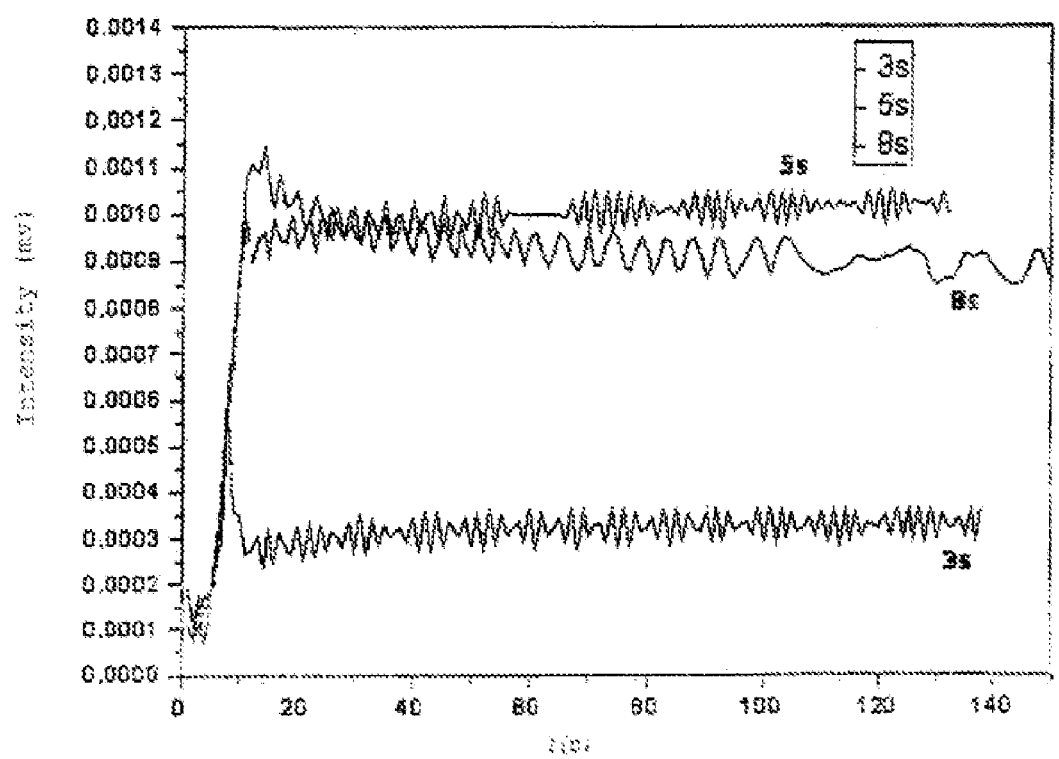
FIG. 1 intensity of the transmission hologram from Reference Example 1 after various illumination times.

In an advantageous development of the invention, the composition contains the following components:
(a) from 4.9 to 95.9% by weight of one or more polymerizable or polycondensable organic monomer(s),
(b) from 0.1 to 50% by weight of at least one ionic liquid,
(c) from 0 to 5% by weight of one or more additive(s) selected from among thermal or photochemical crosslinking initiators, sensitizing agents, wetting agents, bonding agents, leveling agents, antioxidants, stabilizers, dyes, photochromic or thermochromic compounds.

It is advantageous for all components of the composition to be miscible with one another. Preference is given to at least two of the components being present in a joint phase, particularly preferably the ionic liquid(s) and the monomer(s), and very particular preference is given to all constituents being present in a joint phase.

The content of at least one ionic liquid is advantageously in the range from 1 to 50% by weight, preferably from 15 to 50% by weight, particularly preferably from 20 to 40% by weight, very particularly preferably from 20 to 30% by weight.

The polymerizable or polycondensable organic monomer or the polymerizable or polycondensable organic monomers can in principle comprise any species known to those skilled in the art which is suitable for polymerization or polycondensation. Thus, it is possible to use, for example, polymerizable or polycondensable monomers, oligomers or prepolymers. The monomers can also contain more than one polymerizable or polycondensable group. Preference is given to monomers which give transparent polymers.

Specific examples of polymerizable or polycondensable organic monomers are (meth)acrylic acid, (meth)acrylic esters, (meth)acrylonitrile, styrene and styrene derivatives, alkenes (e.g. ethylene, propylene, butene, isobutene), halogenated alkenes (e.g. tetrafluoroethylene, chlorotrifluoroethylene, vinyl chloride, vinyl fluoride, vinylidene fluoride, vinylidene chloride), vinyl acetate, vinylpyrrolidone, vinylcarbazole and mixtures thereof. Multiply unsaturated monomers can also be present, e.g. butadiene and (meth)acrylic esters of polyols (e.g. diols).

Preference is given to acrylates or methacrylates, in particular methyl methacrylate, a diol(meth)acrylate or a diol di(meth)acrylate, e.g. hexanediol dimethacrylate (HDMA), hexanediol diacrylate, dodecanediol dimethacrylate and dodecanediol diacrylate.

Particular preference is also given to acrylates or methacrylates having one or more polymerizable groups, known as crosslinkers, which are modified with oligomers and/or polymers. Very particular preference is given to monomers having a molecular weight of up to 5000 g/mol, preferably up to 1500 g/mol, particularly preferably in the range from 27 g/mol to 600 g/mol. Examples of such monomers are polyethylene glycol di(meth)acrylates (PEGDMA), polyethylene glycol (meth)acrylates (PEGMA), tetramethylene glycol di(meth) acrylates (TMGDMA), bisphenol A di(meth)acrylates (BPADMA) or tetraethylene glycol di(meth)acrylates (TEGDMA).

For the purposes of the invention, the term (meth)acrylates encompasses both the respective acrylate and the respective methylacrylate; this applies analogously to (meth)acrylic acid and (meth)acrylic esters. According to the invention, the composition contains at least one ionic liquid. This term refers to salts, usually having at least one organic component, which are liquid at temperatures below 100° C., preferably room temperature. A suitable choice of the combination of cations and anions makes it possible to set the properties of the ionic liquid within a wide range so as to correspond to the desired properties such as viscosity, solubility of the components, thermal or photochemical stability, density, melting point, polarity or hydrophobicity (Wasserscheid et al. 2003).

Since most ionic liquids are neither inflammable nor have a measurable vapor pressure, they are already used in many reactions as replacement for or addition to conventional solvents, including for polymerization processes (Kubisa et al. 2005; Winterton 2006), for example for the polymerization of olefins, oxidative polymerizations, enzymatic polymerizations, free-radical polymerizations, transition metal-catalyzed polymerizations and "reverse atom transfer radical" polymerizations. In the case of free-radical polymerizations, a significantly improved polymerization rate was found in ionic liquids. Compared to conventional solvents, higher molecular weights of the polymers obtained and better conversion of the monomers are achieved when using ionic liquids. (Hong et al., 2002; Zhang et al. 2002; Strehmel et al. 2006).

The ionic liquid or ionic liquids preferably have the general formula $K^+A^-$.

The cations ($K^+$) are preferably selected from the group consisting of ammonium, phosphonium, uronium, thiouronium, guanidinium cations and heterocyclic cations.

As ammonium cations, it is possible to choose cations having the general formula (1)

[NR$_4$]$^+$ where
the radicals R can each be, independently of one another, H, with the proviso that at least two substituents R in formula (1) are H,
OR', NR'$_2$, with the proviso that not more than one substituent R in formula (1) is OR', NR'$_2$,
straight-chain or branched alkyl having 1-20 carbon atoms,
straight-chain or branched alkyl having 2-10 carbon atoms and one or more double bonds,
straight-chain or branched alkyl having 2-20 carbon atoms and one or more triple bonds,
saturated, partially unsaturated or fully unsaturated cycloalkyl which has 3-7 carbon atoms and may be substituted by alkyl groups having 1-6 carbon atoms,
where one or more radicals R may be partially or fully substituted by halogens or partially substituted by —OH, —OR', —CN, —C(O)OH, —C(O)NR'$_2$, —SO$_2$NR'$_2$, —SO$_2$OH, —NO$_2$ and one or more nonadjacent carbon atoms of R which are not in the α position may be replaced by atoms and/or atom groups selected from the group consisting of —O—, —S—, —S(O)—, —SO$_2$—, —C(O)—, —C(O)  O—, —N$^+$R'$_2$—, —P(O)R'O—, —C(O)NR'—, —SO$_2$NR'—, —OP(O)R'O—, —P(O)(NR'$_2$)NR'—, —PR'$_2$=N— or —P(O)R— where R'=H, unfluorinated, partially fluorinated or perfluorinated C$_1$-C$_6$-alkyl, C$_3$-C$_7$-cycloalkyl, unsubstituted or substituted phenyl.

As phosphonium cations, it is possible to choose cations having the general formula (2)

[PR$^2_4$]$^+$ where
the radicals R are each, independently of one another, H, OR', NR'$_2$,
straight-chain or branched alkyl having 1-20 carbon atoms,
straight-chain or branched alkyl having 2-20 carbon atoms and one or more double bonds,
straight-chain or branched alkyl having 2-20 carbon atoms and one or more triple bonds,
saturated, partially unsaturated or fully unsaturated cycloalkyl which has 3-7 carbon atoms and may be substituted by alkyl groups having 1-6 carbon atoms,
where one or more radicals R$^2$ may be partially or fully substituted by halogens or partially substituted by —OH, —OR', —CN, —C(O)OH, —C(O)NR'$_2$, —SO$_2$NR'$_2$, —SO$_2$OH, —NO$_2$ and one or more nonadjacent carbon atoms of R$^2$ which are not in the α-position may be replaced by atoms and/or atom groups selected from the group consisting of —O—, —S—, —S(O)—, —SO$_2$—, —C(O)—, —C(O)O—, —N$^+$R'$_2$—, —P(O)R'O—, —C(O)NR'—, —SO$_2$NR'—, —OP(O)R'O—, —P(O)(NR'$_2$)NR'—, —PR'$_2$=N— or —P(O)R'—, where R'=H, unfluorinated, partially fluorinated or perfluorinated C$_1$-C$_6$-alkyl, C$_3$-C$_7$-cycloalkyl, unsubstituted or substituted phenyl.

As uronium cations, it is possible to choose cations having the general formula (3)

[(R$^3$R$^4$N)—C(=OR$^5$)(NR$^6$R$^7$)]$^+$ 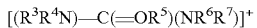

where
R$^3$ to R$^7$ are each, independently of one another,
H, where H is excluded for R$^5$,
straight-chain or branched alkyl having 1-20 carbon atoms,
straight-chain or branched alkyl having 2-20 carbon atoms and one or more double bonds,
straight-chain or branched alkyl having 2-20 carbon atoms and one or more triple bonds,
saturated, partially unsaturated or fully unsaturated cycloalkyl which has 3-7 carbon atoms and may be substituted by alkyl groups having 1-6 carbon atoms,
where one or more of R$^3$ to R$^7$ may be partially or fully substituted by halogens or partially substituted by —OH, —OR', —CN, —C(O)OH, —C(O)NR'$_2$, —SO$_2$NR'$_2$, —SO$_2$OH, —NO$_2$, and one or more nonadjacent carbon atoms of R$^3$ to R$^7$ which are not in the α position may be replaced by atoms and/or atom groups selected from the group consisting of —O—, —S—, —S(O)—, —SO$_2$—, —C(O)—, —C(O)O—, —N$^+$R'$_2$—, —P(O)R'O—, —C(O) NR'—, —SO$_2$NR'—, —OP(O)R'O—, —P(O)(NR'$_2$)NR'—, —PR'$_2$=N— and —P(O)R'—, where R'=H, unfluorinated, partially fluorinated or perfluorinated C$_1$-C$_6$-alkyl, C$_3$-C$_7$-cycloalkyl, unsubstituted or substituted phenyl.

As thiouronium cations, it is possible to choose cations having the general formula (4)

[(R$^3$R$^4$N)—C(=SR$^5$)(NR$^6$R$^7$)]$^+$ 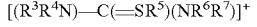

where
R$^3$ to R$^7$ are each, independently of one another,
H, where H is excluded for R$^5$, straight-chain or branched alkyl having 1-20 carbon atoms, straight-chain or branched alkyl having 2-20 carbon atoms and one or more double bonds, straight-chain or branched alkyl having 2-20 carbon atoms and one or more triple bonds, saturated, partially unsaturated or fully unsaturated cycloalkyl which has 3-7 carbon atoms and may be substituted by alkyl groups having 1-6 carbon atoms, where one or more of $R^3$ to $R^7$ may be partially or fully substituted by halogens or partially substituted by —OH, —OR', —CN, —C(O)OH, —C(O)NR'$_2$, —SO$_2$NR'$_2$, —SO$_2$OH, —NO$_2$ and one or more nonadjacent carbon atoms of $R^3$ to $R^7$ which are not in the α position may be replaced by atoms and/or atom groups selected from the group consisting of —O—, —S—, —S(O)—, —SO$_2$—, —C(O)—, —C(O)O—, —N$^+$R'$_2$—, —P(O)R'O—, —C(O)NR'—, —SO$_2$NR'—, —OP(O)R'O—, —P(O)(NR'$_2$)NR'—, —PR'$_2$=N— and —P(O)R'—, where R'=H, unfluorinated, partially fluorinated or perfluorinated $C_1$-$C_6$-alkyl, $C_3$-$C_7$-cycloalkyl, unsubstituted or substituted phenyl.

As guanidinium cations, it is possible to choose cations having the general formula (5)

$$[C(NR^8R^9)(NR^{10}R^{11})(NR^{12}R^{13})]^+$$

where $R^8$ to $R^{13}$ are each, independently of one another,

H, —CN, —NR'$_2$, —OR', straight-chain or branched alkyl having 1-20 carbon atoms, straight-chain or branched alkyl having 2-20 carbon atoms and one or more double bonds, straight-chain or branched alkyl having 2-20 carbon atoms and one or more triple bonds, substituted, partially unsaturated or fully unsaturated cycloalkyl which has 3-7 carbon atoms and may be substituted by alkyl groups having 1-6 carbon atoms, where one or more of $R^8$ to $R^{13}$ may be partially or fully substituted by halogens or partially substituted by —OH, —OR', —CN, —C(O)OH, —C(O)NR'$_2$, —SO$_2$NR'$_2$, —SO$_2$OH, —NO$_2$ and one or more nonadjacent carbon atoms of $R^8$ to $R^{13}$ which are not in the α position may be replaced by atoms and/or atom groups selected from the group consisting of —O—, —S—, —S(O)—, —SO$_2$—, —C(O)—, —C(O)O—, —N$^+$R'$_2$—, —P(O)R'O—, —C(O)NR'—, —SO$_2$NR'—, —OP(O)R'O—, —P(O)(NR'$_2$)NR'—, —PR'$_2$=N— and —P(O)R'—, where R'=H, unfluorinated, partially fluorinated or perfluorinated $C_1$-$C_6$-alkyl, $C_3$-$C_7$-cycloalkyl, unsubstituted or substituted phenyl.

As heterocyclic cations, it is possible to choose cations having the general formula (6)

$$[HetN]^+$$

where

[HetN]$^+$ is selected from the group consisting of imidazolium, 1H-pyrazolium, 3H-pyrazolium, 4H-pyrazolium, 1-pyrazolinium, 2-pyrazolinium, 3-pyrazolinium, 2,3-dihydroimidazolinium, 4,5-dihydroimidazolinium, 2,5-dihydroimidazolinium, pyrrolidinium, 1,2,4-triazolium, 1,2,3-triazolium, pyridinium, pyridazinium, pyrimidinium, piperidinium, morpholinium, pyrazinimium, thiazolium, oxazolium, indolium, quinolinium, isoquinolinium, quinoxalinium and indolinium. The cations can have different or identical substituents corresponding to the substituents indicated above for $R^8$.

The cations [HetN]$^+$ are preferably compounds of the general formula (7)

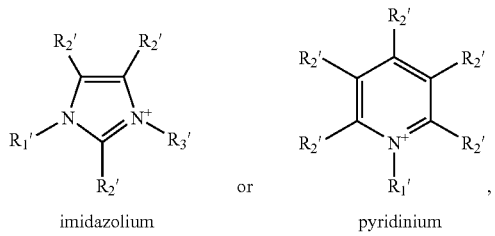

imidazolium    or    pyridinium where the substituents $R_1'$ to $R_3'$ are each, independently of one another, H, —CN, —NR'$_2$, —OR', P(O)R'$_2$, —P(O)(OR')$_2$, —P(O)NR'$_2$)$_2$, —C(OR)R', —C(O)OR', straight-chain or branched alkyl having 1-20 carbon atoms, straight-chain or branched alkyl having 2-20 carbon atoms and one or more double bonds, straight-chain or branched alkyl having 2-20 carbon atoms and one or more triple bonds, saturated, partially unsaturated or fully unsaturated cycloalkyl which has 3-7 carbon atoms and may be substituted by alkyl groups having 1-6 carbon atoms, saturated, partially or fully unsaturated heteroaryl, heteroaryl-$C_1$-$C_6$-alkyl or aryl-$C_1$-$C_6$-alkyl, where the substituents $R_1'$, $R_2'$ and/or $R_3'$ together can also form a ring system, where one or more of the substituents $R_1'$ to $R_3'$ may be partially or fully substituted by halogens or partially substituted by —OH, —OR', —CN, —C(O)OH, —C(O)NR'$_2$, —SO$_2$NR'$_2$, —SO$_2$OH, —NO$_2$ and one or more nonadjacent carbon atoms of the substituents $R_1'$ to $R_3'$ which are not bound to the heteroatom may be replaced by atoms and/or atom groups selected from the group consisting of —O—, —S—, —S(O)—, —SO$_2$—, —C(O)—, —C(O)O—, —N$^+$R'$_2$—, —P(O)R'O—, —C(O)NR'—, —SO$_2$NR'—, —OP(O)R'O—, —P(O)(NR'$_2$)NR'—, —PR'$_2$=N— and —P(O)R'—, where R'=H, unfluorinated, partially fluorinated or perfluorinated $C_1$-$C_6$-alkyl, $C_3$-$C_7$-cycloalkyl, unsubstituted or substituted phenyl.

For the purposes of the present invention, fully unsaturated substituents include aromatic substituents.

Possible substituents R and $R^2$ to $R^{13}$ of the compounds of the formulae (1) to (5) are not only hydrogen but preferably $C_1$-$C_{20}$—, in particular $C_1$-$C_{14}$-alkyl groups and saturated or unsaturated, i.e. also aromatic, $C_3$-$C_7$-cycloalkyl groups which may be substituted by $C_1$-$C_6$-alkyl groups, in particular phenyl.

The substituents R and $R^2$ are preferably methyl, ethyl, n-propyl, isopropyl, n-butyl, sec-butyl, tert-butyl, pentyl, hexyl, octyl, decyl or tetradecyl.

Preference is given to the substituents $R^3$ to $R^{13}$ each being, independently of one another, a straight-chain or branched alkyl group having from 1 to 10 carbon atoms. The substituents $R^3$ and $R^4$, $R^6$ and $R^7$, $R^8$ and $R^9$, $R^{10}$ and $R^{11}$ and $R^{12}$ and $R^{13}$ in the compounds of the formulae (3) to (5) can be identical or different. Particular preference is given to $R^3$ to $R^{13}$ each being, independently of one another, methyl, ethyl, n-propyl, isopropyl, n-butyl, sec-butyl, tert-butyl, pentyl, hexyl, octyl, phenyl, cyclohexyl or benzyl.

Possible substituents $R_1'$ to $R_3'$ of compounds of the formula (7) are not only hydrogen but preferably $C_1$-$C_{20}$—, in particular $C_1$-$C_{12}$-alkyl groups and saturated or unsaturated, i.e. also aromatic, $C_3$-$C_7$-cycloalkyl groups which may be substituted by $C_1$-$C_6$-alkyl groups, in particular phenyl.

Preference is given to the substituents $R_1'$ to $R_3'$ each being, independently of one another, methyl, ethyl, n-propyl, isopropyl, n-butyl, sec-butyl, tert-butyl, pentyl, hexyl, octyl, phenyl, cyclohexyl or benzyl, particularly preferably methyl, ethyl, n-propyl, n-butyl, sec-butyl, tert-butyl or hexyl.

Particular preference is given to the substituents $R_2'$ and $R_3'$ each being, independently of one another, hydrogen, methyl, ethyl, n-propyl, isopropyl, n-butyl, sec-butyl, tert-butyl, pentyl, hexyl, cyclohexyl or benzyl.

For further cations which can be used according to the invention, reference may be made to the German patent application DE 10 2005 025 315 A1, U.S. Patent Application Publication 2008/0194831 A1, which is hereby explicitly incorporated by reference.

The anions ($A^-$) are preferably selected from the group consisting of halides, acetates, phosphates, phosphinates, aluminates, borates, sulfates, sulfonates, imides, amides and cyanates.

In the case of the halides, preference is given to chlorides, bromides, iodides and polyhalides such as $I_3^-$ or $Br_3^-$.

In the case of the phosphates, preference is given to fluorinated phosphates such as hexafluorophosphates or tris(pentafluoroethyl)trifluorophosphate or monoalkylated or dialkylated and/or monobenzylated or dibenzylated phosphates, if appropriate fully or partially substituted, in particular fully or partially fluorinated.

In the case of the borates, preference is given to tetrahaloborates such as $[BF_4]^-$, or anionic boron complexes with 1,2-dicarbonyl compounds, for example bisoxalato($2^-$) borates.

In the case of the sulfates, preference is given to hydrogensulfates or monoalkylated or monobenzylated sulfates, if appropriate fully or partially substituted, in particular fully or partially fluorinated.

In the case of the sulfonates, preference is given to triflates and tosylates and derivatives thereof, for example trifluoromethanesulfonates, para-toluenesulfonates or mesitylsulfonates.

In the case of the imides, preference is given to imides of sulfonates, for example bis(trifluoromethanesulfonyl)imide.

In the case of the amides, dicyanamide is preferred.

Particularly preferred ionic liquids having the general formula $[K^+A^-]$ are 1-n-butyl-3-methylimidazolium chloride ([BMIM]Cl), 1-n-hexyl-3-methylimidazolium chloride ([HMIM]Cl), 1-methyl-3-n-octylimidazolium chloride ([OMIM[Cl), 1-n-butyl-3-methylimidazolium tetrafluoroborate ([BMIM][$BF_4$]), 1-n-hexyl-3-methylimidazolium tetrafluoroborate ([HMIM][$BF_4$]), 1-methyl-3-n-octylimidazolium tetrafluoroborate ([OMIM][$BF_4$), 1-n-butyl-3-methylimidazolium hexafluorophosphate ([BMIM][$PF_6$]), 1-n-hexyl-3-methylimidazolium hexafluorophosphate ([HMIM][$PF_6$]) or 1-methyl-3-n-octylimidazolium hexafluorophosphate ([OMIM][$PF_6$]). Many ionic liquids are commercially available, for example from Merck (Darmstadt, Del.), Sigma-Aldrich (St. Louis, US) or Solvent Innovation (Cologne, Del.).

As mentioned above, it has now surprisingly been found that the ionic liquids allow a very sharp and precise formation of the refractive index gradient. In addition, the glass transition temperature of the polymer formed is reduced and the flexibility of the optical elements produced is increased. Furthermore, virtually no shrinkage occurs in the illuminated regions in the optical elements produced in this way. As a result, even very thick optical elements are possible. Both properties therefore allow the production of particularly thin and also particularly thick optical elements.

The composition can additionally contain additives customary for optical systems. Examples are plasticizers, thermal or photochemical crosslinking initiators, sensitizers, wetting agents, bonding agents, leveling agents, antioxidants, stabilizers, dyes and photochromic or thermochromic compounds.

Possible catalysts/initiators or crosslinking initiators are all customary initiators/initiator systems known to those skilled in the art, including free-radical photoinitiators, free-radical thermoinitiators, cationic photoinitiators, cationic thermoinitiators and any combinations thereof.

Under certain circumstances, the crosslinking initiator can be dispensed with entirely, e.g. if appropriate in the case of electron beam or laser curing.

Specific examples of free-radical photoinitiators which can be used are Irgacure® 184 (1-hydroxycyclohexyl phenyl ketone), Irgacure® 500 (1-hydroxycyclohexyl phenyl ketone, benzophenone) and other photoinitiators of the Irgacure® type obtainable from Ciba-Geigy, Darocure 1173, 1116, 1398, 1174 and 1020 (Merck), benzophenone, 2-chlorothioxanthone, 2-methylthioxanthone, 2-isopropylthioxanthone, benzoin, 4,4'-dimethoxybenzoin, benzoin ethyl ether, benzoin isopropyl ether, benzyl dimethyl ketal, 1,1,1-trichloroacetophenone, diethoxyacetophenone and dibenzosuberone.

Examples of free-radical thermoinitiators are preferably organic peroxides in the form of diacyl peroxides, peroxydicarbonates, alkyl peresters, alkyl peroxides, dialkyl peroxides, perketals, ketone peroxides and alkyl hydroperoxides and also azo compounds. Specific examples which may be mentioned here are, in particular, dibenzoyl peroxide, tert-butyl perbenzoate and azobisisobutyronitrile. An example of a cationic photoinitiator is Cyracure® UVI-6974, while a preferred cationic thermoinitiator is 1-methylimidazole.

The polycondensation-initiating catalysts are, for example, Brönsted acids and bases such as mineral acids or tertiary amines for anionic polycondensation and Lewis acids such as metal alkoxides (e.g. aluminum alkoxides in the case of epoxysilanes) for cationic polycondensation. When epoxide groups participate, the addition of ring-opening catalysts such as N-alkylimidazoles is particularly advantageous.

If appropriate, the composition can additionally contain one or more solvents, preferably organic solvents, for example alcohols such as ethanol, isopropanol or butanol, ketones such as acetone, esters such as ethyl acetate, ethers such as tetrahydrofuran and aliphatic, aromatic and halogenated hydrocarbons such as hexane, benzene, toluene and chloroform.

The proportion of solvent in the composition can be varied before or after production of the refractive index gradient, for example by heating. Preference is given to a proportion of solvent of from 0 to 30% by weight.

In an advantageous development, the composition can additionally contain a matrix material. This is advantageous particularly when monomers which are not modified with an oligomer or polymer are used. The matrix added can influence both the formation of the refractive index gradient by, for example, influencing the diffusion of the monomers and, also, as indicated above, the refractive index gradient being formed. In addition, the matrix can contribute to stabilizing the refractive index gradient. Preference is given to matrix materials which are soluble in the composition.

The amount of matrix material is not critical and can be in the range from 0.1 to 98% by weight.

The matrix material can comprise a polymerizable or polycondensable organic monomers, oligomer and/or prepolymer, an organic polymer and/or a condensate of one or more hydrolysable, if appropriate organically modified inorganic compounds. The matrix material preferably comprises at least one organic polymer.

The organic polymers which may be present in the matrix material can be any known plastics. Preference is given to polymers which dissolve in the abovementioned solvents and mixtures thereof, e.g. polyacrylic acid, polymethacrylic acid, polyacrylates, polymethacrylates, polyethylene glycols, polyolefins, polystyrene, polyamides, polyimides, polyvinyl compounds such as polyvinyl chloride, polyvinyl alcohol, polyvinyl butyral, polyvinyl acetate, polyvinylpyrrolidone, paravinylguaiacol and corresponding copolymers, e.g. poly (ethylene-vinyl acetate), polyesters, e.g. polyethylene terephthalate or polydiallyl phthalate, polyarylates, polycarbonates, polyethers, e.g. polyoxymethylene, polyethylene oxide and polyphenylene oxide, polyether ketones, polysulfones, polyepoxides, fluorinated polymers, e.g. polytetrafluoroethylene, and organopolysiloxanes. They are preferably transparent polymers.

In an advantageous development, the composition can also contain a preferably transparent, curable matrix.

In this case, the term curing refers to polymerizations, polycondensations and/or polyadditions which lead to solidification of the matrix.

The amount of curable matrix is not critical and can be in the range from 0.1 to 98% by weight. This applies particularly in an advantageous way when stabilization of the refractive index gradient is required. The curable matrix influences the formation of the refractive index gradient by, for example, altering the diffusion of the monomers. In addition, it is also possible, as indicated above, to utilize the refractive index difference between matrix and the polymerized or polycondensed monomers to form the refractive index gradient. Curing of the matrix can be carried out either before, during or after the generation of the potential difference, preferably before generation of the potential difference.

Preference is given to using matrix materials or precursors of the curable matrix which are soluble in the composition.

The curable matrix can be, for example, one of the customary organic binder systems for surface coatings and resins. Curing of the matrix can occur physically or preferably chemically. The curable matrix can comprise oxidatively curing, cold-curing or thermally or radiation curing resins. The curable matrix materials can be one- or two-component surface coatings. Preference is given to chemically curing or crosslinkable binder systems. Such curable binder systems are well known to those skilled in the art.

Examples of binder systems or surface coatings which can be used or polymers or oligomers used therefor or precursors thereof are the customary binder systems known from the prior art. In particular, they are organic polymers, oligomers or precursors thereof. Precursors of the polymers or oligomers are understood to mean the monomers or low-molecular-weight polymerization, condensation or addition products formed therefrom, from which the polymers or oligomers are derived.

Examples of binder systems or surface coatings or the organic polymers or oligomers used for this purpose are epoxy resin coatings such as bisphenol A resins, bisphenol F resins, aliphatic and heterocyclic epoxy resins or thermoplastic epoxy coating resins; oil coatings containing oils such as linseed oil, wood oil or soyabean oil, which may if appropriate be modified with polybutadiene oils; nitrocellulose coatings containing nitrocelluloses; coatings comprising cellulose esters of organic acids, e.g. esters of cellulose with acetic acid or butyric acid or the anhydrides thereof, where, for example, cellulose acetobutyrates are also used in polyurethane coatings; chlororubber coatings containing, for example, chlorinated polyisoprene, polypropylene or polyethylene; coatings comprising polyvinyl compounds or polyvinyl resins, such as polyolefins, e.g. polyethylene, ethylene-vinyl acetate copolymers and ethylene-maleic acid/maleic anhydride copolymers, PVC, polyvinylidene chloride, polyvinyl alcohol, polyvinyl acetals, e.g. polyvinyl butyral, polyvinyl ethers, e.g. methyl or ethyl ether, polyvinyl esters, e.g. polyvinyl acetate (PVA) and polyethylene terephthalate, polyvinylpyrrolidone, polystyrene, styrene-acrylonitrile copolymers (SAN), acrylonitrile-butadiene-styrene copolymers (ABS), styrene-maleic ester copolymers, styrene-butadiene copolymers and styrene-maleic anhydride copolymers; surface coatings based on acrylic resins such as polyacrylic acid, polymethacrylic acid, polyacrylamide, acrylic esters or methacrylic esters, e.g. polymethyl(meth)acrylate; alkyd resins containing dibasic acids or anhydrides such as phthalic acid and phthalic anhydride and polyols or condensation products thereof which are oil- or fatty acid-modified; saturated polyester resin coatings containing saturated polyesters derived from saturated monomers having two or more functional groups (OH and/or COOH groups); polyurethane coatings which are frequently used as two-component systems and contain blocked or unblocked polyisocyanates and polyhydroxyl compounds; silicone resin coatings; urea, melamine and phenolic resin coatings; and also polyarylates, polyamides, polyethers, polyimides and polycarbonates. It is also possible to use combinations of these surface coatings or these polymers. It is always also possible to use the precursors, e.g. the monomers of the polymers or oligomers mentioned.

Preferred binder systems are polyurethane resin coatings and polyepoxy resin coatings. The binder system also comprises any hardeners or crosslinkers used.

Preference is given to a binder system which does not react with the monomers used and thus reacts independently of the polymerization of the photopolymers.

Preferred organic polymers or oligomers or precursors thereof used, e.g. monomers, are polyepoxides, polyols, unblocked or in particular blocked polyisocyanates, polyesters, polyamines, polycarboxylic acids or polycarboxylic anhydrides, each of which contain two or more functional groups. Here, the expression "poly" relates to the functional group and not to the degree of polymerization. Accordingly, the polyols have two or more hydroxy groups and can in each case be a monomer, oligomer or polymer (e.g. a polyurethane). Specific components are illustrated by way of example below with the aid of preferred binder systems.

It is possible to use epoxide-based binder systems known to those skilled in the art. Examples of polyepoxides are bisphenol A resins (e.g. condensation products of bisphenol A and epichlorohydrin), bisphenol F resins (e.g. condensation products of bisphenol F and epichlorohydrin), aliphatic epoxy resins (e.g. low-viscosity glycidyl ethers), cycloaliphatic epoxy resins and heterocyclic epoxy resins (e.g. triglycidyl isocyanurate) or thermoplastic epoxy resin coatings. Such systems also include the use of "expanding monomers" (e.g. spiroorthocarbonates or spiroorthoesters), which can also be formed in situ. Polyepoxide resins are frequently admixed with hardeners for film formation in order to achieve crosslinking. Possible hardeners are organic or inorganic compounds which bear reactive hydrogen and can react with epoxide or hydroxyl groups. Examples of hardeners used are polyamines (e.g. diamines such as ethylenediamine, cyclohexamine derivatives), polyaminoamide resins, polyisocyanates, hydroxyl-containing synthetic resins such as urea resins, melamine resins and phenolic resins, fatty acids and organic acids having reactive double bonds, e.g. acrylic acid or methacrylic acid. When the latter hardener is used, crosslinking can also be effected by electron radiation.

Polyisocyanates are used, for example, for polyurethane resins. The polyisocyanate can have two or more isocyanate groups. It can be, for example, aliphatic, alicyclic, aromatic or heterocyclic, monocyclic or polycyclic.

It is possible to use customary polyisocyanates, e.g. monomeric polyisocyanates, polyisocyanate adducts, modified polyisocyanates or mixtures thereof. These are known to the those skilled in the art and are commercially available.

The polyisocyanate adducts are, for example, those which are customarily employed as hardeners for two-component urethane coatings.

Examples of suitable polyisocyanates are the diisocyanates known from polyurethane chemistry, e.g. 1,3-diisocyanatobenzene, tolylene 2,4- and 2,6-diisocyanate (TDI), hexamethylene 1,6-diisocyanate (HMDI), diphenylmethane 4,4'- and 2,4-diisocyanate (MDI), naphthylene diisocyanate, xylylene diisocyanate, isophorone diisocyanate, para-phenyl diisocyanate, dicyclohexylmethane diisocyanate, cyclohexyl diisocyanate, polymethylpolyphenyl isocyanate, dodecamethylene 1,6-diisocyanate, 1,4-bis(isocyanatocyclohexyl)methane, pentamethylene diisocyanate, trimethylene diisocyanate, triphenylmethane diisocyanate and also the higher molecular weight polyisocyanates derived from these diisocyanates, e.g. isocyanurate-, uretdione-, allophanate- and biuret-based polyisocyanates.

The isocyanates can be obtained, for example, under the trade names Desmodur and Baymidur (from Bayer), CARADATE (from Shell), TEDIMONX (from Enichem) and LUPRANAT (from BASF). Examples of monomeric polyisocyanates having more than two isocyanate groups are 4-isocyanatomethyloctane 1,8-diisocyanate and aromatic polyisocyanates such as triphenylmethane 4,4',4''-triisocyanate or polyphenylpolymethylene polyisocyanates.

The polyisocyanate can be used in blocked form in order to prevent occurrence of an uncontrolled, fast reaction and becomes reactive only after deblocking, e.g. by heating. The blocking of isocyanates is a method known to those skilled in the art for reversibly reducing the reactivity of isocyanates. Possible blocking agents for blocking the isocyanates are all customary blocking agents such as acetone oxime, cyclohexanone oxime, methyl ethyl ketoxime, acetophenone oxime, benzophenone oxime, 3,5-dimethylpyrazole, 1,2,4-triazole, ethyl malonate, ethyl acetoacetate, s-caprolactam, phenol or ethanol.

As polyol component, it is possible to use pure dialcohols, trialcohols or polyalcohols, e.g. ethylene glycol, trimethylolpropane, or partially hydrolyzed fatty acid glycerides. However, these are usually used only as a starting basis for relatively high molecular weight polyhydroxyl compounds. These can be, for example, more or less branched polyester polyols (Desmophen® grades) formed using dicarboxylic acids or polyether polyols (Desmophen® U grades) formed by molecular addition of epoxides. Other examples are hydroxy-functional acrylic resins (Desmophen A grades).

Polyurethane resin coatings can be formed from the polyisocyanates and the polyols. It will naturally be necessary, especially in the case of unblocked polyisocyanates, to mix the components with one another only shortly before use. Polyisocyanates can also be reacted with compounds having other functional groups containing active hydrogen. Examples of such groups are thiol groups (—SH), primary or secondary amino groups (—NHR', where R' can be, for example, H, alkyl, cycloalkyl, aryl or corresponding aralkyl and alkaryl groups) or carboxyl groups (—COOH). Reaction products formed in the reaction with isocyanates are urethanes (in the case of hydroxyl and carboxyl), thiourethanes (in the case of thiol) or ureas (in the case of amine).

Polyamides are condensation products of diamines and dicarboxylic acids or derivatives thereof, with it being possible to use aliphatic and/or aromatic compounds. Polyamides having aromatic units are of particular interest with regard to the thermal stability. Polyimides, e.g. polycondensates of aromatic diamines such as benzidine, bis(4-aminophenyl) ether or bis(4-(3-aminophenoxy)phenyl) sulfone and aromatic tetracarboxylic acids or derivatives thereof, e.g. benzophenonetetracarboxylic 4,4'-dianhydride or pyromellitic dianhydride, and polybenzimidazoles which are condensation products of aromatic tetramines and dicarboxylic acids or derivatives thereof, also have a high thermal stability. In the composition according to the invention, the corresponding monomers or low molecular weight condensation products can be used instead of the polymers mentioned.

The abovementioned binder systems are particularly suitable for coating compositions. However, they are also suitable as binder systems for molding compositions for producing moldings, including films. Epoxy resins or polyurethane resins are, for example, also well suited to the production of moldings.

When epoxy resins are used, virtually no shrinkage is observed as a result of the polymerization of the monomer. When self-curing resins are used, no illumination is necessary for curing the matrix.

However, curing can also be associated with the reaction of monomers which have not been reacted in the formation of the gradient structure.

In an advantageous development, an organically modified inorganic condensate of polymerizable or polycondensable monomers and/or hydrolysable silanes which may also have polymerizable and/or polycondensable groups can be used as curable matrix material. Such compositions are known, for example, from WO 03/058292, which is hereby expressly incorporated by reference.

In addition, the formation according to the invention of gradient structures can also be applied to composites. For this purpose, nanosize particles which may be surface-modified can be added to the composition according to the invention. Depending on the material of the nanosize particles, these can lead to an increase or reduction in the refractive index. The nanoparticles can likewise have polymerizable or polycondensable surface groups. In the case of these composites too, the process of the invention leads to significant improvements. The production and surface modification of the nanosize particles are known from WO 03/058292, which is hereby expressly incorporated by reference. Depending on the embodiment, the nanosize particles can be used as diffusing component, i.e. analogous to the monomers, or else as constituent of the matrix.

Furthermore, the invention also provides an optical element having a gradient structure, where the gradient structure is formed by a refractive index gradient, comprising the following components:
(a) from 4.9 to 98% by weight of one or more organic polymers,
(b) from 0.1 to 50% by weight of at least one ionic liquid,
(c) from 0 to 5% by weight of one or more additives selected from among thermal or photochemical crosslinking initiators, sensitizing agents, wetting agents, bonding agents, leveling agents, antioxidants, stabilizers, dyes, photochromic or thermochromic compounds.

In an advantageous development of the invention, the polymer or polymers is/are selected from the group consisting of poly(meth)acrylic acid and derivatives, poly(meth)acrylates, poly(meth)acrylonitriles, polystyrenes and polystyrene derivatives, polyalkenes, halogenated polyalkenes, polyvinyl acetate, polyvinylpyrrolidone, polyvinylcarbazole, poly (polyethylene glycol) (meth)acrylates, poly(polyethylene glycol) di(meth)acrylates.

The content of at least one ionic liquid is advantageously in the range from 1 to 50% by weight, preferably from 15 to 50% by weight, particularly preferably from 20 to 40% by weight, very particularly preferably from 20 to 30% by weight.

In a further advantageous development, the optical element additionally contains from 0.1 to 98% by weight of one or more organic polymers selected from the group consisting of polyacrylates, polymethacrylates, polyepoxides, polyvinyls, polyethylenes and polyethylene glycols.

In a further advantageous development, the optical element additionally contains from 0.1 to 98% by weight of a cured matrix composed of polymers and/or of condensate of hydrolysable silanes which may also have polymerizable and/or polycondensable groups. Examples of such condensates may be found in WO 03/058292, which is hereby expressly incorporated by reference.

In the case of polymers, preference is given to polyurethane resin coatings and polyepoxy resin coatings.

In a further advantageous development, the optical element additionally comprises nanosize particles which may be surface-modified. Examples of suitable particles, which may be surface-modified, may be found in WO 03/058292, which is hereby expressly incorporated by reference.

The components for producing the composition, or a precursor thereof, may be mixed with one another in any manner or order.

To carry out coating, substrates suitable for optical applications, for example glass, ceramic, silicon, metal, semiconductor materials or (preferably transparent) plastics such as PET, PE and PP, are preferably selected. A particularly preferred substrate is a plastic film. Coating can be carried out by conventional methods, e.g. by dipping, flooding, doctor blade coating, casting, centrifugal coating, squirting, painting, slot coating, meniscus coating, tape casting, spinning or spraying. Naturally liquid precursors of the composition are suitable for this purpose, with the required viscosity being able to be set, for example, by addition or removal of solvent(s). As an alternative, the choice of the ionic liquid or of any curable matrix used can influence the viscosity. Preferred layer thicknesses (of the finished coating) are from 0.2 to 300 µm, particularly preferably in the range from 0.2 to 100 µm.

In this form, the sheet material can be rolled up and temporarily stored under controlled temperature conditions (15 to 30° C.) while being protected from light. A film composite can also be produced in this way. Films having a coating which has a refractive index gradient, on to which, if appropriate, a second film has been laminated (film composite) are preferred optical elements according to the invention.

A potential difference is subsequently generated in the composition in the above-described way, so that a refractive index gradient is formed by directed diffusion and the induced local polymerization or polycondensation. The potential difference is preferably generated by an illumination process.

The processes occurring in the generation of a potential difference are explained below for a preferred embodiment.

As a result of local illumination, the monomers of the composition polymerize to form polymers. Both linear and also branched polymers can be formed here. This forms a chemical potential gradient for as yet unpolymerized monomers in the direction of the unilluminated adjacent region. Further monomers therefore diffuse from this adjacent region into the illuminated region. This process can occur during and after illumination and takes from a few seconds to a few minutes, depending on the illumination conditions and the temperature. In this way, a local refractive index gradient is formed by the refractive index difference between the various regions having different degrees of polymerization.

The precursors of the curable matrix which may be added can be cured before application of the potential difference, during and also after application of the potential difference, preferably after application of the potential difference.

If appropriate, the ionic liquids and/or the unreacted monomers can also be removed after formation of the refractive index gradient, for example by washing out. It is thus also possible to produce optical relief structures using these systems. These relief structures can also be produced in combination with gradient structures.

In summary, the process of the invention allows gradient structures having significantly sharper refractive index gradients to be produced in an inexpensive and efficient way. As a result, it is possible, for example, to achieve a significant improvement in the optical properties of the same thickness of the material. The production of such systems is made significantly simpler and cheaper in this way. At the same time, a great variability, for example in respect of the monomers used, can also be achieved since the properties of the ionic liquid and/or the matrix can be matched very flexibly to the desired circumstances.

The process of the invention is particularly suitable for producing optical elements having a refractive index gradient. The optical elements are suitable, in particular, as holographic applications, light management films, diffusers, planar gradient index lenses in imaging optics, head-up displays, head-down displays, optical waveguides, especially in optical news and media technology, and optical data stores. Examples of optical elements which can be produced are security holograms, image holograms, digital holograms for information storage, systems having components which process light wave fronts, planar waveguides, beam dividers and lenses.

In a preferred embodiment of the invention for producing a transmission hologram, a polymer-modified (meth)acrylate monomer is admixed with an ionic liquid (from 15 to 50% by weight) and a photoinitiator (from 0.02 to 0.1% by weight) and stirred to form a homogeneous mixture. The composition obtained is applied to a glass surface and covered with a second glass plate. The layer thickness is in the range from 0.5 to 5 µm. Phase-modulated volume holograms are produced both as transmission holograms and as reflection holograms by means of two-wave mixing of a laser beam having a wavelength in the range from 300 nm to 500 nm and an intensity in the range from 0.5 to 2 mW/m$^2$. The illumination time is in the range from 1 second to 10 minutes, preferably from 1 to 10 seconds. The reflection or transmission holograms obtained have significantly increased stability and a significantly sharper refractive index gradient at the same layer thickness. In addition, a stable hologram is obtained in a significantly shorter illumination time.

In a further preferred embodiment of the invention for producing a diffuser, a polymer-modified (meth)acrylate monomer is admixed with an ionic liquid (from 15 to 50% by weight, preferably in the range from 20 to 30% by weight) and a photoinitiator (from 0.02 to 0.1% by weight) and stirred to form a homogeneous mixture. The composition obtained is applied to a patterned mask having a random transparent/dark pattern with a grain size in the range from 1 μm to 20 μm and covered with a plastic film as protective film. The film composite is smoothed and illuminated through the mask by a light source, preferably a UV lamp, having a light intensity in the range from 40 mW/cm$^2$ to 100 mW/cm$^2$. The illumination time is in the range from 10 seconds to 10 minutes. After generation of the refractive index gradient, illumination is carried out again, but this time from the opposite side, i.e. not through the mask, in order to polymerize unreacted monomers of the photopolymer.

In a further preferred embodiment of the invention for producing a diffuser, from 5 to 30% by weight of a binder system, preferably an epoxy resin and a crosslinker, are added to the composition described above.

In this example, too, the diffusers obtained have a significantly improved angle dependence of the transmission at the same layer thickness.

Further details and features can be derived from the following description of preferred illustrative embodiments in combination with the dependent claims. Here, the respective features can be realized either alone or in combination with one another. The possible ways of solving the problem addressed by the invention are not restricted to the illustrative embodiments.

Thus, for example, ranges indicated always encompass all intermediate values which are not mentioned and all conceivable subintervals.

Production of a Transmission Hologram

Reference Example 1

Poly(ethylene glycol) methacrylate (2.0 g) monomer (Sigma-Aldrich Co.) and Initiator Irgacure 184 (0.1 g, Ciba Specialty Chemicals (Pty) Ltd) are stirred at room temperature in a reaction vessel for 5 minutes by means of a magnetic stirrer to form a homogeneous composition. A glass surface is then coated with the light-sensitive material and the coating (thickness: 1.5 μm) is covered with a second glass plate. Phase-modulated volume holograms are produced as transmission hologram by means of two-wave mixing. The laser beam of an argon ion laser having an intensity in the range from 0.5 to 2 mW/m$^2$ and a wavelength of 351 nm is focused to a diameter of about 0.5 mm and divided by means of a beam divider into two subbeams having the same intensity. The interference between these two beams leads to a spatially periodic change in the light intensity.

Example 2

Poly(ethylene glycol) methacrylate (2.0 g) monomer (Sigma-Aldrich Co.), [BMIM]BF$_4$ (0.5 g), prepared as described by Creary et al. 2005, and Initiator Irgacure 184 (0.1 g, Ciba Specialty Chemicals (Pty) Ltd) are stirred at room temperature in a reaction vessel for 5 minutes by means of a magnetic stirrer to form a homogeneous composition. A glass surface is then coated with the light-sensitive material and the coating (thickness: 1.5 μm) is covered with a second glass plate. Phase-modulated volume holograms are produced as transmission hologram by means of two-wave mixing. The laser beam of an argon ion laser having an intensity in the range from 0.5 to 2 mW/m$^2$ and a wavelength of 351 nm is focused to a diameter of about 0.5 mm and divided by means of a beam divider into two subbeams having the same intensity. The interference between these two beams leads to a spatially periodic change in the light intensity.

The gradient structure formed is measured using an He—Ne laser having a wavelength of 633 nm as reference. The light produced by the grating was measured using a "lock-in" amplifier M 850. The transmission hologram produced has a refractive index modulation of 0.01 (633 nm).

Production of Light-Diffusing Photopolymer Composite Films (Diffusers)

Example 3

Poly(ethylene glycol) methacrylate (4.0 g) (Sigma-Aldrich Co.), [BMIM]BF$_4$ (1.0 g), prepared as in Example 1, and photoinitiator Irgacure 184 (0.2 g, Ciba Specialty Chemicals (Pty) Ltd) are stirred at room temperature for 5 minutes by means of a magnetic stirrer to form a homogeneous composition. The composition is then applied to a mask having a random transparent/dark pattern having a scale of a few microns (thickness: 75 μm) and covered with a PET film (thickness: 75 μm) as protective film. The thickness of the layer was determined by a PET film having a thickness of 75 μm placed on the mask as limitation of the coating area. The composite film is smoothed by means of a roller and illuminated through the mask with a light source (Oriel UV lamp, 1000 W, 58 mW/cm$^2$) for 30 seconds. Illumination is then carried out again for 30 seconds using the same light source, but from the opposite side, i.e. not through the mask. This gives a diffuser having excellent diffusion properties and high transmission.

Example 4

Poly(ethylene glycol) methacrylate (4.0 g) (Sigma-Aldrich Co.), [BMIM]BF$_4$ (2.0 g), prepared as in Example 1, epoxy resin (0.8 g of Epoxyl L20, R&G Faserverbundwerkstoffe GmbH), crosslinker (0.2 g, VE 3261, R&G Faserverbundwerkstoffe GmbH, 3-aminomethyl-3,5,5-trimethylcyclohexylamine) and photoinitiator Irgacure 184 (0.1 g, Ciba Specialty Chemicals (Pty) Ltd) are stirred at room temperature for 28 hours by means of a magnetic stirrer to form a homogeneous composition. The composition is then applied to a mask having a random transparent/dark pattern having a scale of a few microns (thickness: 75 μm) and covered with a PET film (thickness: 75 μm) as protective film. The thickness of the layer was determined by a PET film having a thickness of 75 μm placed on the mask as limitation of the coating area. The composite film is smoothed and illuminated through the mask with a light source (Oriel UV lamp, 1000 W, 58 mW/cm$^2$) for 30 seconds. Illumination is then carried out again for 30 seconds using the same light source, but from the opposite side, i.e. not through the mask. This gives a diffuser having excellent diffusion properties and high transmission.

Example 5

Triethylene glycol dimethacrylate (3.4 g) (Sigma-Aldrich Co.), [BMIM]BF$_4$ (1.0 g), prepared as in Example 1, epoxy resin (0.4 g of Epoxyl L20, R&G Faserverbundwerkstoffe GmbH, bisphenol A-epichlorohydrin resin and bisphenol F-epichlorohydrin resin), crosslinker (0.1 g, VE 3261, R&G Faserverbundwerkstoffe GmbH), and photoinitiator Irgacure 184 (0.1 g, Ciba Specialty Chemicals (Pty) Ltd) are stirred at room temperature for 28 hours by means of a magnetic stirrer to form a homogeneous composition. The composition is then applied to a mask having a random transparent/dark pattern having a scale of a few microns (thickness: 75 μm) and covered with a PET film (thickness: 75 μm) as protective film. The thickness of the layer was determined by a PET film having a thickness of 75 μm placed on the mask as limitation of the coating area. The composite film is smoothed and illuminated through the mask with a light source (Oriel UV lamp, 1000 W, 58 mW/cm$^2$) for 30 seconds. Illumination is then carried out again for 30 seconds using the same light source, but from the opposite side, i.e. not through the mask. This gives a diffuser having excellent diffusion properties and high transmission.

Reference Example 6

Poly(ethylene glycol) methacrylate (3.5 g) (Sigma-Aldrich Co.) and photoinitiator Irgacure 184 (0.1 g, Ciba Specialty Chemicals (Pty) Ltd) are stirred at room temperature for 5 minutes by means of a magnetic stirrer to form a homogeneous composition. The composition is then applied to a mask having a random transparent/dark pattern having a scale of a few microns (thickness: 75 μm) and covered with a PET film (thickness: 75 μm) as protective film. The thickness of the layer was determined by a PET film having a thickness of 75 μm placed on the mask as limitation of the coating area. The composite film is smoothed and illuminated through the mask with a light source (Oriel UV lamp, 1000 W, 58 mW/cm$^2$) for 30 seconds. Illumination is then carried out again for 30 seconds using the same light source, but from the opposite side, i.e. not through the mask. This gives a diffuser as reference example.

Reference Example 7

Poly(ethylene glycol) methacrylate (3.4 g) (Sigma-Aldrich Co.), epoxy resin (0.4 g of Epoxyl L20, R&G Faserverbundwerkstoffe GmbH), crosslinker (0.1 g, VE 3261, R&G Faserverbundwerkstoffe GmbH) and photoinitiator Irgacure 184 (0.1 g, Ciba Specialty Chemicals (Pty) Ltd) are stirred at room temperature for 24 hours by means of a magnetic stirrer to form a homogeneous composition. The composition is then applied to a mask having a random transparent/dark pattern having a scale of a few microns (thickness: 75 μm) and covered with a PET film (thickness: 75 μm) as protective film. The thickness of the layer was determined by a PET film having a thickness of 75 μm placed on the mask as limitation of the coating area. The composite film is smoothed and illuminated through the mask with a light source (Oriel UV lamp, 1000 W, 58 mW/cm$^2$) for 30 seconds. Illumination is then carried out again for 30 seconds using the same light source, but from the opposite side, i.e. not through the mask. This gives a diffuser as reference example.

Figure 2:
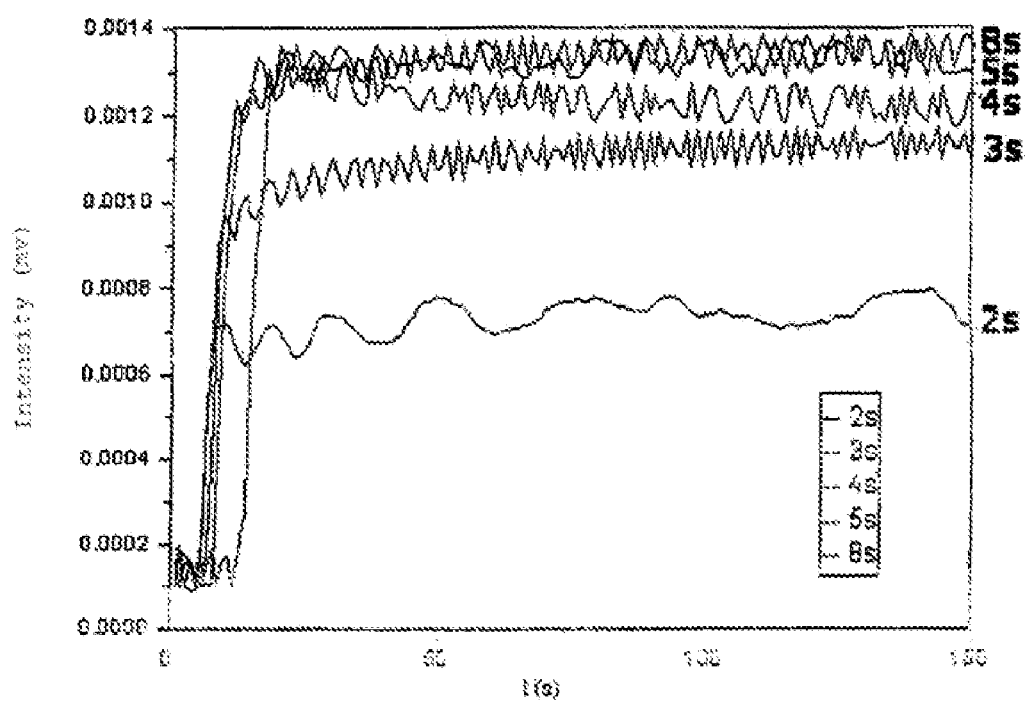
FIG. 2 intensity of the transmission hologram from Example 2 after various illumination times.

FIG. 1 and FIG. 2 show the measured intensity of the reference beam at 633 nm of the transmission hologram from reference example 1 and example 2 after different illumination times. The illumination time was controlled by means of an electronic shutter.

Compared to the composition without the ionic liquid, the quality of the grating formed is significantly improved. It is not only formed in a shorter time but is also more regular and more stable.

Figure 3:
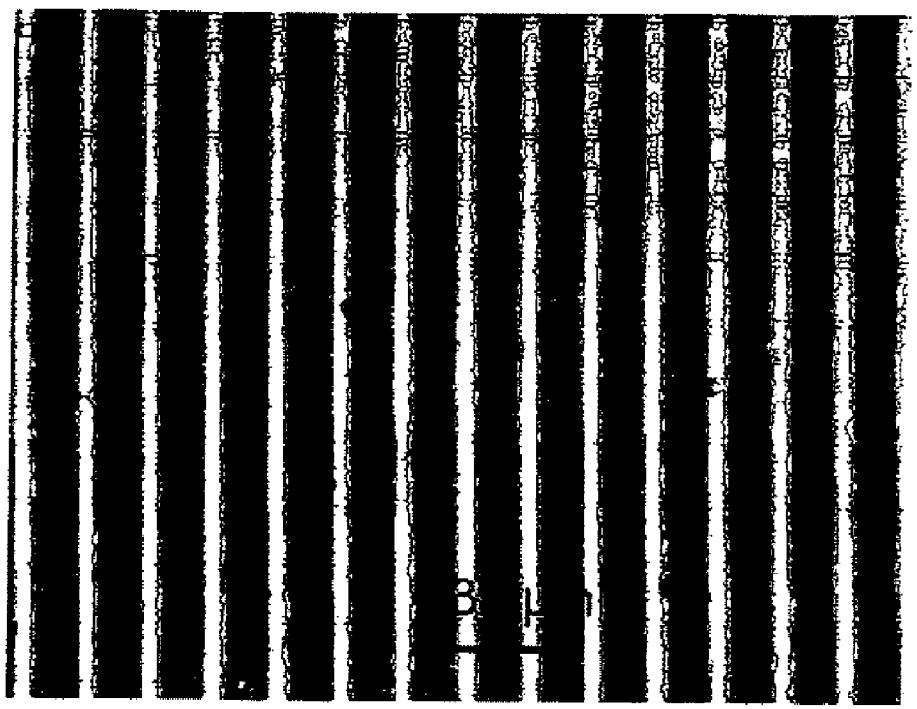
FIG. 3 optical micrograph of the gradient structure produced in Example 2.

FIG. 3 shows an enlarged photograph of the diffraction grating from Example 2 taken using an optical microscope.

Figure 4:
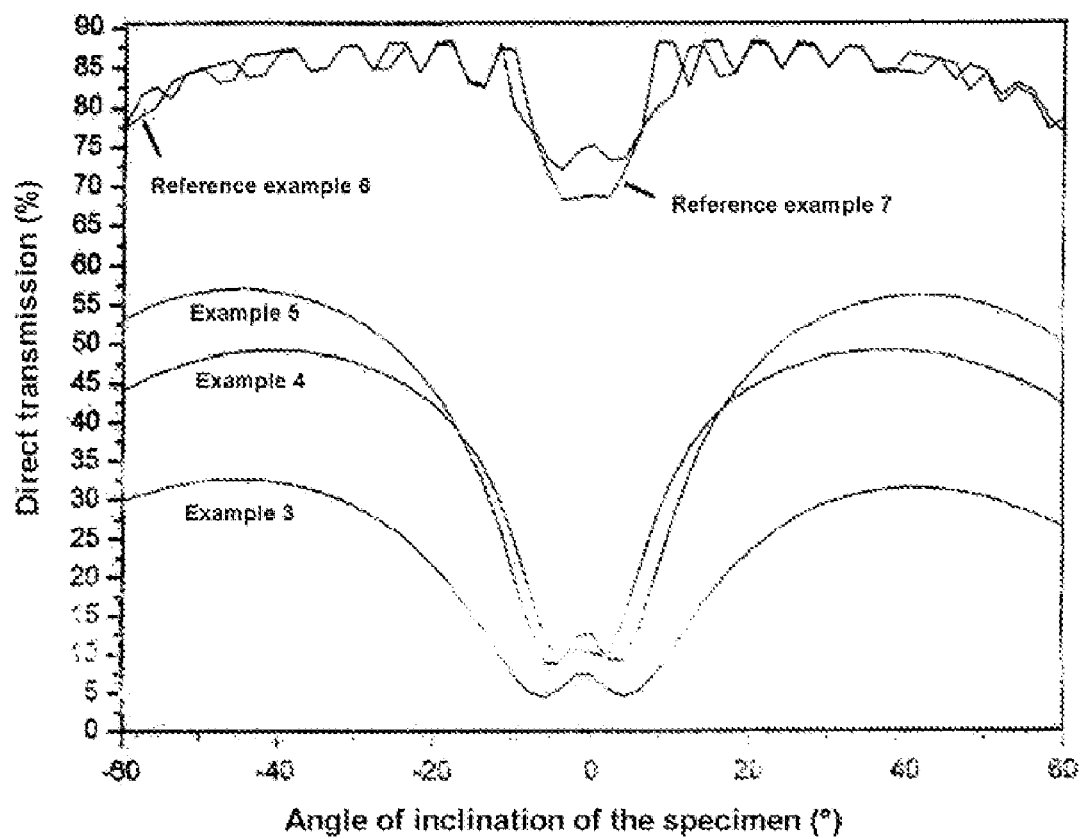
FIG. 4 optical profile of the diffusers produced.

FIG. 4 shows a measurement of the angle dependence of the direct transmission of the diffuser of Examples 3-5 and Reference Examples 6 and 7 using polychromatic light. The improvement in the optical properties achieved by the process of the invention can clearly be seen.

LIST OF THE REFERENCES CITED

U.S. Pat. No. 5,552,261
U.S. Pat. No. 5,529,473
U.S. Pat. No. 3,658,526
U.S. Pat. No. 4,959,284
U.S. Pat. No. 4,942,112
U.S. Pat. No. 5,013,632
U.S. Pat. No. 5,098,803
U.S. Pat. No. 6,482,551
U.S. Pat. No. 5,453,340
US 2003/0157414
US 2005/0231773
U.S. Pat. No. 7,022,392
U.S. Pat. No. 6,969,578
U.S. Pat. No. 6,268,089
U.S. Pat. No. 7,163,769
US 2005/0101698
WO 03/058292
"Ionic Liquids in Synthesis", P. Wasserscheid, T. Welton, Eds., Wiley-VCH, Weinheim, 2003.
P. Kubisa, J. Polym. Sci. Part A Polym. Chem. 2005, 43, 4675-4683.
N. Winterton, J. Mater. Chem., 2006, 16, 4281-4293
K. Hong, H. Zhang, J. M. Mays, A. E. Visser, C. S. Brazel, J. H. Holbrey, W. M. Reichert, R. D. Rogers, Chem. Commun., 2002, 1368-1369.
H. Zhang, K. Hong, J. W. Mays, Macromolecules, 2002, 35, 5738-5741.
V. Strehmel, A. Laschewsky, H. Wetzel, E. Görnitz, Macromolecules, 2006, 39, 923-930.
H. Kogelnik, "Coupled wave theory for thick hologram gratings", Bell Syst. Techn. J., 1969, 48, 2909-2947.
X. Creary, E. D. Wilis, Organic Synthesis, 2005, 82, 166.

The invention claimed is:

1. A process for producing optical elements having a gradient structure comprising:
(a) production of a composition by mixing one or more polymerizable or polycondensable organic monomers and at least one ionic liquid having the general formula [K$^+$A$^-$]; and
(b) generation of a potential difference by directed diffusion of the monomers to form a refractive index gradient by initiation of local polymerization or polycondensation, wherein the potential difference is generated by holographic or lithographic techniques.

2. The process as claimed in claim 1, wherein the composition comprises the following components:
(a) from 4.9 to 98% by weight of one or more polymerizable or polycondensable organic monomer(s),
(b) from 0.1 to 50% by weight of at least one ionic liquid,
(c) from 0 to 5% by weight of one or more additives selected from the group consisting of thermal or photochemical crosslinking initiators, sensitizing agents, wetting agents, bonding agents, leveling agents, antioxidants, stabilizers, dyes, photochromic and thermochromic compounds.

3. The process as claimed in claim 1, wherein the polymerizable or polycondensable organic monomer or the polymerizable or polycondensable organic monomers is/are selected from the group consisting of (meth)acrylic acid and derivatives, (meth)acrylic esters and derivatives, (meth)acrylonitriles, styrenes and styrene derivatives, alkenes, halogenated alkenes, vinyl acetate, vinylpyrrolidone and vinylcarbazole.

4. The process as claimed in claim 1, wherein the cations of the ionic liquid or the ionic liquids are selected from the group consisting of ammonium, phosphonium, uronium, thiouronium, guanidinium cations and heterocyclic cations.

5. The process as claimed in claim 1, wherein the anions of the ionic liquid or the ionic liquids are selected from the group consisting of halides, acetates, aluminates, phosphates, phosphinates, borates, sulfates, sulfonates, imides, amides and cyanates.

6. The process as claimed in claim 2, wherein the composition further comprises from 0.1 to 98% by weight of one or more organic polymers.

7. The process as claimed in claim 6, wherein the organic polymer or the organic polymers is/are selected from the group consisting of polyacrylates, polymethacrylates, polyepoxides, polyvinyls, polyethylenes and polyethylene glycols.

8. The process as claimed in claim 2, wherein the composition comprises from 0.1 to 98% by weight of a curable matrix material composed of polymerizable or polycondensable organic monomers and/or oligomers and/or prepolymers or precursors of the curable matrix material.

9. The process as claimed in claim 8, wherein the curable matrix material is produced from polymerizable or polycondensable monomers and/or hydrolysable silanes which may also have polymerizable and/or polycondensable groups.

10. The process as claimed in claim 8, wherein the curable matrix material is selected from the group consisting of polyurethane resin coatings and polyepoxy resin coatings.

11. The process as claimed in claim 8, wherein the composition is shaped to form a molding or applied to a substrate and thermally and/or photochemically cured before formation of the refractive index gradient.

12. The process as claimed in claim 1, wherein nanosize particles which may be surface-modified are additionally added to the monomers.

13. The process as claimed in claim 1, wherein the potential difference is generated by UV light or laser light.

* * * * *